United States Patent [19]

Bellersen et al.

[11] Patent Number: 5,117,278
[45] Date of Patent: May 26, 1992

[54] SEMICONDUCTOR DEVICE HAVING A SEMICONDUCTOR BODY EMBEDDED IN AN ENVELOPE MADE OF SYNTHETIC MATERIAL

[75] Inventors: Michael F. B. Bellersen, Hamburg, Fed. Rep. of Germany; Wilhelmus F. M. Gootzen, Eindhoven, Netherlands

[73] Assignee: U.S. Philips Corporation, New York, N.Y.

[21] Appl. No.: 713,023

[22] Filed: Jun. 6, 1991

Related U.S. Application Data

[63] Continuation of Ser. No. 510,751, Apr. 18, 1990, abandoned.

[30] Foreign Application Priority Data

Apr. 20, 1989 [NL] Netherlands ............... 8900989

[51] Int. Cl.⁵ .................................. H01L 23/28
[52] U.S. Cl. .................................. 357/72; 357/54; 357/71
[58] Field of Search ............ 357/54, 72, 54 A, 54 G, 357/54 M, 54 N, 54 S, 52, 71, 71 S, 71 P

[56] References Cited

U.S. PATENT DOCUMENTS

| | | | |
|---|---|---|---|
| 4,485,393 | 11/1984 | Kumamaru et al. | 357/54 X |
| 4,543,707 | 10/1985 | Ito et al. | 357/54 X |
| 4,646,126 | 2/1987 | Iizuka | 357/71 K X |
| 4,686,559 | 8/1987 | Hasnell | 357/54 |
| 4,719,502 | 1/1988 | Ikeya et al. | 357/72 |
| 4,795,722 | 1/1989 | Welch et al. | 357/54 X |
| 4,829,363 | 5/1989 | Thomas et al. | 357/71 |
| 4,855,801 | 8/1989 | Kuesters | 357/54 X |
| 4,929,988 | 5/1990 | Yoshikawa | 357/71 X |
| 4,933,744 | 6/1990 | Segawa et al. | 357/72 |
| 4,967,248 | 10/1990 | Shimizu | 357/23.6 G |

FOREIGN PATENT DOCUMENTS

| | | | |
|---|---|---|---|
| 0308127 | 3/1989 | European Pat. Off. | 357/52 |
| 53-148972 | 12/1978 | Japan | 357/73 |

OTHER PUBLICATIONS

Lee, H. et al. *Epoxy Resins, Their Applicaitons and Technology* McGraw-Hill, 1957, pp. 146-154.

Ghandhi, S. *VLSI Fabrication Principles*, John Wiley, 1983, pp. 422-430.

*Primary Examiner*—Andrew J. James
*Assistant Examiner*—Sara W. Crane
*Attorney, Agent, or Firm*—Paul R. Miller

[57] ABSTRACT

Semiconductor device with a wiring pattern 3, 6 is provided with an insulating layer 4 embedded in an envelope 5 made of synthetic material. To prevent hair cracks in the insulating layer 4, the thickness of the insulating layer 4 is so chosen that the lowest point of top 8 of the insulating layer 4 is at a higher leverl than the highest point of the wiring pattern 3, 6.

14 Claims, 1 Drawing Sheet

SEMICONDUCTOR DEVICE HAVING A SEMICONDUCTOR BODY EMBEDDED IN AN ENVELOPE MADE OF SYNTHETIC MATERIAL

This is a continuation of application Ser. No. 07/510,751, filed Apr. 18, 1990, now abandoned.

BACKGROUND OF THE INVENTION

The invention relates to a semiconductor device having a semiconductor body which is provided with an insulating layer adjoining the semiconductor body and a conductor track on top of the insulating layer with the conductor track being covered by an insulating layer which is embedded in an envelope made of synthetic material.

A semiconductor device of the type described in the opening paragraph is known from Japanese patent Application 55-132014, in which it is described that the conductor track is often thicker than the insulating layer covering that track. Now if the semiconductor device is exposed to changing temperatures, mechanical strain will occur in the device owing to the difference in coefficient of expansion of the synthetic material of the envelope and the rest of the semiconductor device and owing to the setting and shrinking of the synthetic material. This causes fractures in the insulating layer covering the conductor track and displacement of the conductor track.

The remedy recommended was to choose the thickness of the insulating layer covering the track to be greater than the thickness of the conductor track.

Now that semiconductor devices have become increasingly more complicated, this measure turns out to be insufficient in practice in many cases, especially when conductor tracks are present at various levels.

In that case the problem often occurs that hair cracks are formed in the insulating layer or layers covering the conductor tracks, which results in an attack on the conductor tracks and failure of the semiconductor device.

SUMMARY OF THE INVENTION

The invention has for its object inter alia to obviate the above problem at least substantially.

The invention is based inter alia on the recognition of the fact that, if the problem is to be obviated, the insulating layer covering the conductor tracks must be given a thickness which is adapted to the topography of the cross-sectional area of the semiconductor device.

The semiconductor device according to the invention, therefore, is characterized i that it comprises various conductor tracks at various levels, which tracks are covered by the insulating layer embedded in the envelope made of synthetic material, the lowest point of the top of the insulating layer embedded in the envelope being at a higher level than the highest point of the conductor tracks.

The semiconductor device according to the invention has the advantage that the occurrence of hair cracks in the insulating layer embedded in the envelope made of synthetic material can be reduced to a minimum.

Preferably, the hardness of the insulating layer embedded in the envelope made of synthetic material is greater than that of the envelope in that case.

The term "hardness" is herein understood to means the modulus of elasticity of the relevant material.

The material of the envelope made of synthetic material usually has a hardness of approximately 10 GPa.

Preferably, the hardness of the insulating layer embedded in the envelope is greater than 20 GPa, more preferably greater than 50 GPa.

The insulating layer embedded in the envelope made of synthetic material preferably consists of a material chosen from the group comprising silicon oxide obtained from a silane compound, like tetraethyl orthosilicate, under oxidizing conditions in a plasma, silicon nitride and silicon oxynitride. These materials have a hardness of approximately 100 GPa.

Among these materials, silicon nitride and silicon oxynitride are preferred.

The insulating layer embedded in the envelope made of synthetic material need not consist of a homogeneous layer; it may also comprise various, for example two, sub-layers of different composition, which first and second sub-layers are formed in successive stages.

In this case the first sub-layer consists of a material chosen from the materials listed above for a homogeneous layer, having a hardness of approximately 100 GPa. The preference for the first sub-layer again is for silicon nitride and silicon oxynitride.

The material for the second sub-layer may be chosen from the group of materials listed above, to which is added silicon oxide obtained from polysiloxane.

A hardness of at least 50 GPa is sufficient for the second sub-layer.

BRIEF DESCRIPTION OF THE DRAWINGS

The invention will now be explained further with reference to a few examples and the accompanying drawing.

In the drawing,

FIG. 1 shows diagrammatically and in cross-section a part of a semiconductor device according to the state of the art during a stage of manufacture, while

DESCRIPTION OF THE INVENTION

Figure 1:
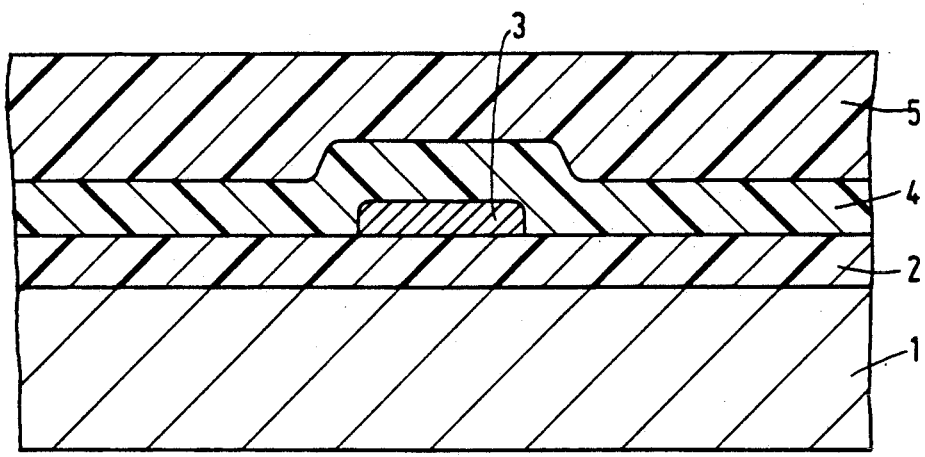

FIG. 1 shows a semiconductor body 1, which is provided with an insulating layer 2 adjoining the semiconductor body 1, on top of which layer 2 there is a conductor track 3, the conductor track 3 being covered by an insulating layer 4 which is embedded in an envelope 5 made of synthetic material.

According to the present state of the art, problems involving displacement of conductor tracks owing to thermo-mechanical strain in semiconductor devices are prevented by choosing the thickness of the insulating layer 4 to be greater than that of the conductor track 3.

Figure 2:
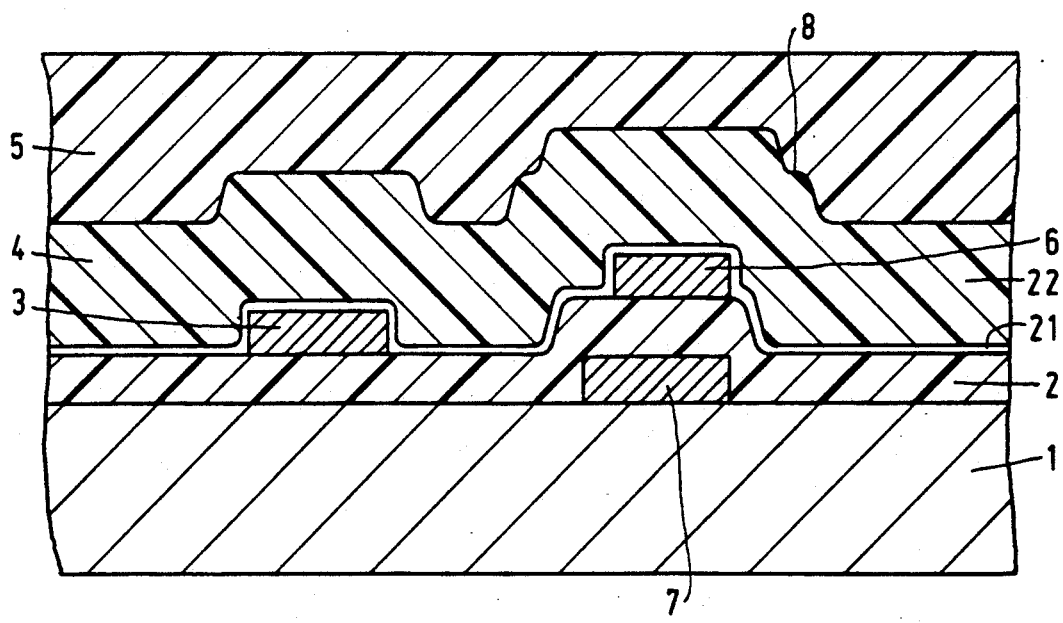
FIG. 2 shows diagrammatically and in cross-section a part of a semiconductor device according to the invention during a stage of manufacture.

For complicated semiconductor devices this measure is often insufficient, namely when conductor tracks 3, 7 are present at different levels. In FIG. 2, for example, conductor track 6 lies above a different conductor structure 7.

The semiconductor device according to the invention comprises various conductor tracks 3, 6 at different levels, covered with the insulating layer 4 embedded in the envelope 5 made of synthetic material, the lowest point of the top 8 of the insulating layer 4 embedded in the envelope 5 being at a higher level than the highest point of the conductor tracks 3, 6.

The hardness of the layer 4 is preferably greater than that of the envelope 5 and greater than 20 GPa, for example greater than 50 GPa.

The insulating layer 4 may consist of two sub-layers 21 and 22 of different composition. The material for the homogeneous layer 4 or a sub-layer 21 is chosen from silicon oxide obtained from a silane compound, like tetraethyl orthosilicate, under oxidizing conditions, silicon nitride and silicon oxynitride, preferably the latter two materials. For the sub-layer 22, silicon dioxide obtained from polysiloxane is also suitable.

EXAMPLE 1

A 0.6 μm thick conductor track 7 made of polysilicon is provided on a semiconductor body 1 made from silicon having the p-type conductivity. The silicon body 1 and the conductor track 7 are covered with a 0.8 μm thick insulating layer 2 made of silicon oxide. On the insulating layer 2 there are 1 μm thick conductor tracks 3, 6 made of an aluminium alloy, and on top of this an insulating, 3 μm thick layer 4 made of silicon oxynitride, the entire assembly being embedded in an envelope 5 consisting of an epoxy resin filled with silicon oxide. The methods for obtaining the semiconductor device are those which are conventional in semiconductor technology.

EXAMPLE 2

The semiconductor device in this example is different from the previous example in that, instead of a homogeneous layer 4, two sub-layers 21 and 22 are used, which are 0.5 μm and 2.5 μm thick, respectively, and which consist of silicon oxynitride and of silicon oxide obtained from polysiloxane, respectively.

The invention is not limited to the examples given and can be varied in many ways within the scope of the invention by those skilled in the art. Thus, three instead of two sub-layers may be used, an intermediate sub-layer being softer than the outermost sub-layers.

We claim:

1. A semiconductor device comprising
   (a) a semiconductor body having at least one conductor track disposed on a surface of said semiconductor body,
   (b) a first insulating layer disposed on said surface of said semiconductor body, said first insulating layer completely covering said at least one conductor track,
   (c) a plurality of different conductor tracks disposed on top of said first insulating layer, various ones of said plurality of different conductor tracks being at different heights above said semiconductor body than others of said plurality of different conductor tracks,
   (d) a second insulating layer disposed on said first insulating layer over said plurality of conductor tracks, said second insulating layer having a variable top surface with a lowest point being at a level above said semiconductor body higher than a highest point of said plurality of conductor tracks above said semiconductor body, and
   (e) an envelope of synthetic material disposed over said second insulating layer, said envelope having a hardness of about 10 GPa,
   wherein said second insulating layer has a hardness greater than said hardness of said envelope.

2. A semiconductor device according to claim 1, wherein said hardness of said second insulating layer is greater than 20 GPa.

3. A semiconductor device according to claim 2, wherein said hardness of said second insulating layer is greater than 50 GPa.

4. A semiconductor device according to claim 1, wherein said second insulating layer is a material selected from the group consisting of silicon oxide obtained from a silane compound under oxidizing conditions in a plasma, silicon nitride, and silicon oxynitride.

5. A semiconductor device according to claim 4, wherein said material is one of silicon nitride or silicon oxynitride.

6. A semiconductor device according to claim 1, wherein said second insulating layer includes several sub-layers.

7. A semiconductor device according to claim 6, wherein said several sub-layers include a first sub-layer and a second sub-layer of a different composition.

8. A semiconductor device according to claim 7, wherein said first sub-layer is a material selected from the group consisting of silicon oxide obtained from a silane compound under oxidizing conditions in a plasma, silicon nitride, and silicon oxynitride.

9. A semiconductor device according to claim 8, wherein said material is one of silicon nitride or silicon oxynitride.

10. A semiconductor device according to claim 8, wherein said second sub-layer is silicon oxide obtained from polysiloxane and a material selected from the group consisting of silicon oxide obtained from a silane compound under oxidizing conditions in a plasma, silicon nitride, and silicon oxynitride.

11. A semiconductor device according to claim 7, wherein said first sub-layer has a hardness of about 100 GPa, and said second sub-layer has a hardness of at least 50 GPa.

12. A semiconductor device according to claim 7, wherein a third sub-layer is disposed intermediate to said first and second sub-layers, said third sub-layer being softer than said second sub-layer.

13. A semiconductor device according to claim 1, wherein said second insulating layer is of a material different from the material of said first insulating layer.

14. A semiconductor device according to claim 1, wherein said envelope of synthetic material is an epoxy resin filled with silicon oxide.

* * * * *